US011378615B2

(12) United States Patent
Chan et al.

(10) Patent No.: US 11,378,615 B2
(45) Date of Patent: Jul. 5, 2022

(54) THERMAL TEST HEAD FOR AN INTEGRATED CIRCUIT DEVICE

(71) Applicant: AEM SINGAPORE PTE LTD, Singapore (SG)

(72) Inventors: See Jean Chan, Singapore (SG); Zhaomeng Wang, Singapore (SG); Yao Kun Leonard Mak, Singapore (SG); MuralliKrishna Govindandhanasekaran, Singapore (SG)

(73) Assignee: AEM SINGAPORE PTE LTD, Singapore (SG)

( * ) Notice: Subject to any disclaimer, the term of this patent is extended or adjusted under 35 U.S.C. 154(b) by 38 days.

(21) Appl. No.: 17/023,014

(22) Filed: Sep. 16, 2020

(65) Prior Publication Data

US 2021/0325452 A1   Oct. 21, 2021

(30) Foreign Application Priority Data

Apr. 20, 2020   (SG) .......................... 10202003589W
Aug. 19, 2020   (SG) .......................... 10202007954R

(51) Int. Cl.
*G01R 31/28* (2006.01)
*G01R 1/04* (2006.01)
*G01R 1/067* (2006.01)
*H01L 35/30* (2006.01)

(52) U.S. Cl.
CPC ....... *G01R 31/2875* (2013.01); *G01R 1/0416* (2013.01); *G01R 1/06722* (2013.01); *G01R 31/2863* (2013.01); *G01R 31/2877* (2013.01); *H01L 35/30* (2013.01)

(58) Field of Classification Search
CPC ............ G01R 31/2831; G01R 31/2874; G01R 31/2877
See application file for complete search history.

(56) References Cited

U.S. PATENT DOCUMENTS

| 6,876,213 | B2 | 4/2005  | Beck              |
|-----------|----|---------|-------------------|
| 7,100,389 | B1 | 9/2006  | Wayburn et al.    |
| 7,243,704 | B2 | 7/2007  | Tustaniwskyj et al. |
| 7,373,967 | B1 | 5/2008  | Tustaniwskyj et al. |
| 7,663,388 | B2 | 2/2010  | Barabi et al.     |
| 8,508,245 | B1 | 8/2013  | Barabi et al.     |
| 9,500,701 | B2 | 11/2016 | Tustaniwskyj et al. |

(Continued)

OTHER PUBLICATIONS

U.S. Appl. No. 17/023,116, titled "Thermal Test Head Foran Integrated Circuit Device," filed on Sep. 16, 2020.

(Continued)

*Primary Examiner* — Tung X Nguyen
(74) *Attorney, Agent, or Firm* — Finnegan, Henderson, Farabow, Garrett & Dunner, LLP

(57) ABSTRACT

A thermal test head for an integrated circuit device includes a heat exchanger assembly, a contact assembly configured to contact the integrated circuit, and a thermal control assembly disposed between the heat exchanger assembly and the contact assembly. The thermal control assembly includes a Peltier device in thermal contact with opposing surfaces of the heat exchanger assembly and the contact assembly, and a spacer in physical contact with the opposing surfaces of the heat exchanger assembly and the contact assembly.

18 Claims, 10 Drawing Sheets

(56) References Cited

U.S. PATENT DOCUMENTS

| | | | |
|---|---|---|---|
| 9,804,223 B2* | 10/2017 | Barabi | G01R 1/0433 |
| 2011/0132000 A1 | 6/2011 | Deane et al. | |
| 2015/0107272 A1* | 4/2015 | Tachibana | F25B 21/02 |
| | | | 62/3.6 |
| 2016/0313390 A1 | 10/2016 | Barabi et al. | |

OTHER PUBLICATIONS

Non-Final Office Action from USPTO, dated Feb. 3, 2022, issued in U.S. Appl. No. 17/023,116, titled "Thermal Test Head for an Integrated Circuit Device." (15 pages).

* cited by examiner

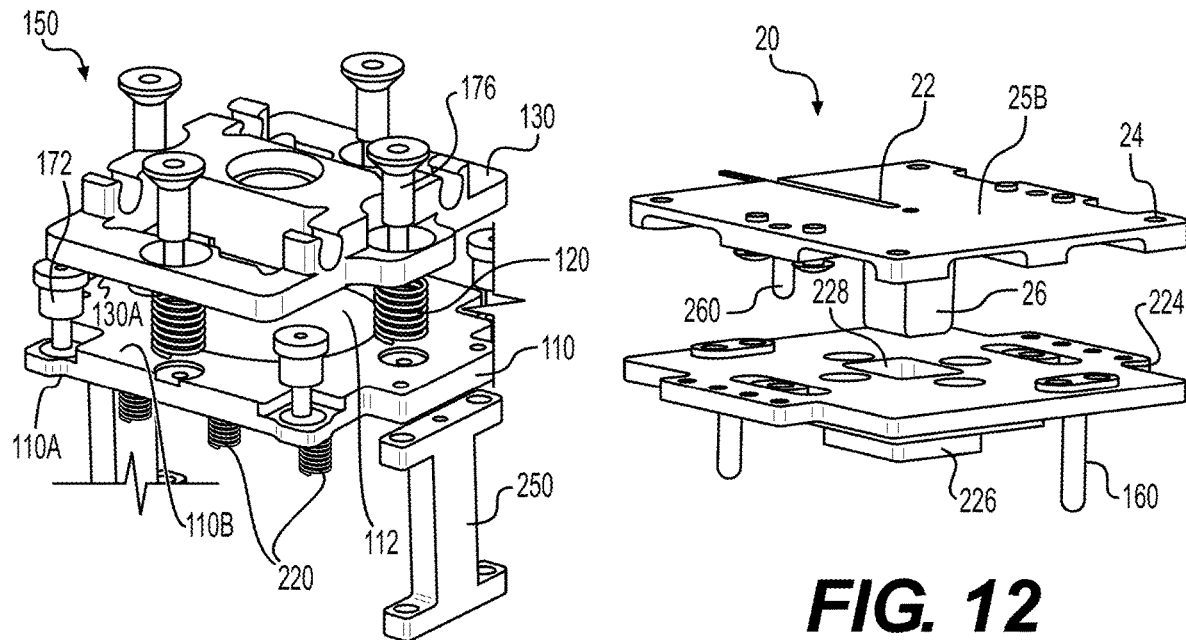
FIG. 11
FIG. 12
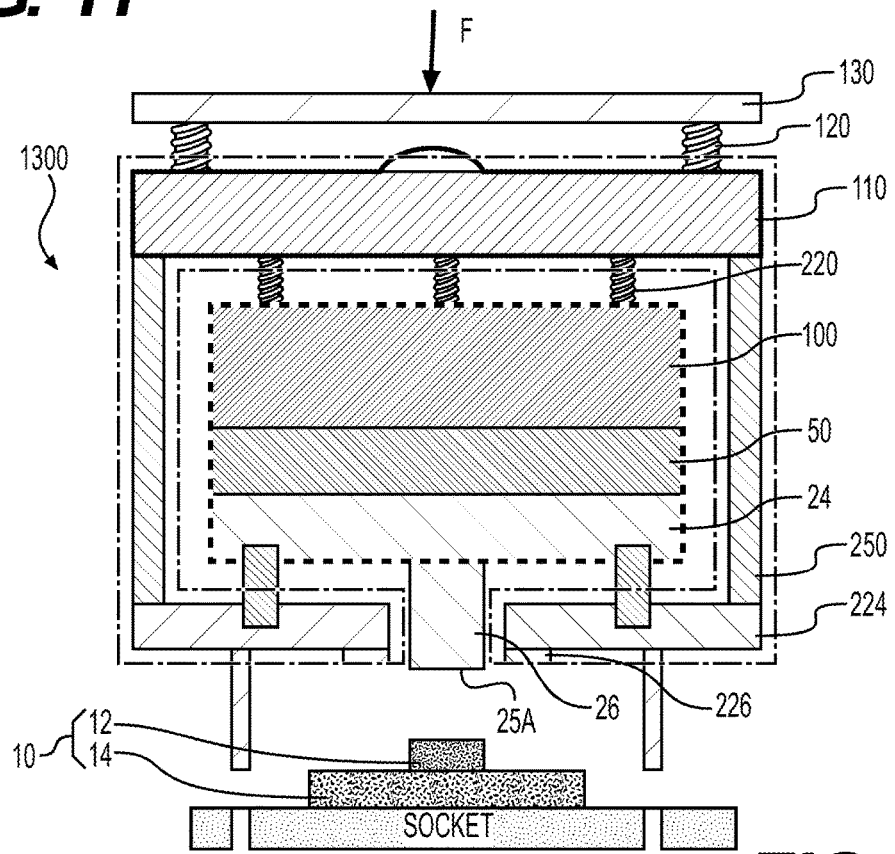
FIG. 13A

THERMAL TEST HEAD FOR AN INTEGRATED CIRCUIT DEVICE

TECHNICAL FIELD

The present disclosure relates generally to thermal test heads used for maintaining the temperature of an integrated circuit (IC) device under test (DUT).

BACKGROUND

Typically, IC devices are subjected to tests (e.g., functional tests) at prescribed temperatures before being shipped to a customer. For example, microprocessor devices are typically subjected to a classification test to determine an effective operating speed of the devices. During such tests, the device under test (typically referred to as a DUT) is maintained at a fixed temperature (or a prescribed temperature) while the device is tested. To maintain the DUT at the prescribed temperature during testing, thermal test heads (sometimes referred to as thermal control units) are typically used. Thermal test heads are configured to heat or cool the DUT to the prescribed temperature, and maintain the device at that temperature, during testing. Such test heads frequently use a thermoelectric heat pump in the form of a Peltier device, to heat or cool the DUT to a desired temperature. A Peltier device is a solid-state heat pump that transfers heat from one side of the device to the other depending on the direction of current through the device. In general, for efficient transfer of heat away from, or to, the DUT, it is helpful to maintain good thermal contact between the Peltier device and other components of the thermal test head. In some applications, a large force is used to press the components of the thermal test head against the DUT to reduce interfacial thermal resistance and achieve good thermal contact between the components. However, repeatedly applying large forces using the test head may degrade the heat transfer capabilities of the test head. The current disclosure is directed at overcoming at least some of the aforementioned problems. The scope of the current disclosure, however, is not defined by the ability to solve any specific problem.

SUMMARY

In one aspect, a thermal test head for an integrated circuit device including a die mounted on a substrate is disclosed. The test head may include a heat exchanger assembly, a die-contact member configured to contact the die, and a thermal control assembly disposed between the heat exchanger assembly and the die-contact member. The thermal control assembly may include a Peltier device in thermal contact with opposing surfaces of the heat exchanger assembly and the die-contact member and a spacer in physical contact with the opposing surfaces of the heat exchanger assembly and the die-contact member.

In another aspect, a thermal test head for an integrated circuit device including a die mounted on a substrate is disclosed. The test head may include a heat exchanger assembly configured to circulate a fluid therethrough, a die-contact member including a contact surface, and a thermal control assembly disposed between the heat exchanger assembly and the die-contact member. The contact surface of the die-contact member may be configured to contact the die. The thermal control assembly may include a Peltier device in thermal contact with opposing surfaces of the heat exchanger assembly and the die-contact member, and one or more spacers disposed at least partially around the Peltier device. The one or more spacers may be in physical contact with the opposing surfaces of the heat exchanger assembly and the die-contact member. The test head may also include an inclination-adjustment device coupled to the heat exchanger assembly opposite the thermal control assembly. The inclination-adjustment device may be configured to change an angular alignment of the contact surface of the die-contact member when the contact surface contacts the die.

In another aspect, a thermal test head for an integrated circuit device including a die mounted on a substrate is disclosed. The thermal test head may include a heat exchanger assembly configured to circulate a fluid therethrough, and a thermally conductive die-contact member including a contact surface. The contact surface may be configured to contact the die. The test head may also include a thermal control assembly disposed between a first surface of the die-contact member and a second surface of the heat exchanger assembly. The thermal control assembly may include a Peltier device, a first layer of thermal interface material disposed between, and in physical contact with, the Peltier device and the first surface of the die-contact member, a second layer of thermal interface material disposed between, and in physical contact with, the Peltier device and the second surface of the heat exchanger assembly, and one or more spacers disposed at least partially around the Peltier device and in physical contact with the first surface of the die-contact member and the second surface of the heat exchanger assembly. A height of the one or more spacers may be substantially equal to a sum of a height of the Peltier device, a height of the first layer of thermal interface material, and a height of the second layer of thermal interface material.

BRIEF DESCRIPTION OF THE DRAWINGS

Reference will be made to exemplary embodiments of the current disclosure that are illustrated in the accompanying figures. For simplicity and clarity of illustration, the figures depict the general structure and/or manner of construction of the various embodiments. Features in the figures are not necessarily drawn to scale. The dimensions of some features may be exaggerated relative to other features to assist understanding of the illustrated embodiments. Features of components that are well known in the art are not depicted to not obscure broad teachings of the current disclosure.

FIG. 11 is an exploded view of the alignment mechanism of the thermal test head of FIG. 7;

FIG. 12 is an exploded view of the contact assembly of the thermal test head of FIG. 7;

and

Figure 7:
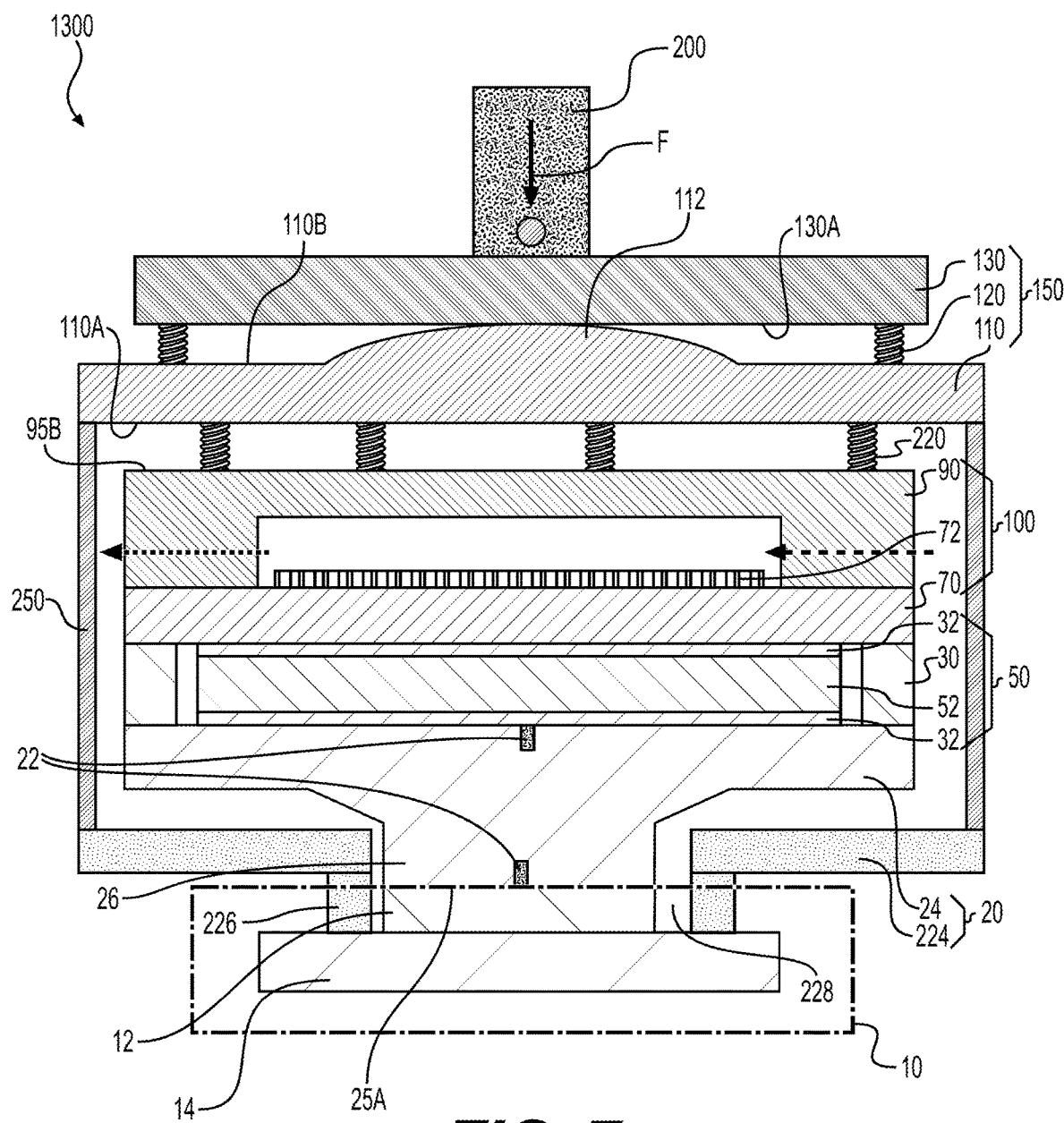
FIG. 7 is a cross-sectional schematic illustration of another exemplary thermal test head of the current disclosure.
Figure 13C:
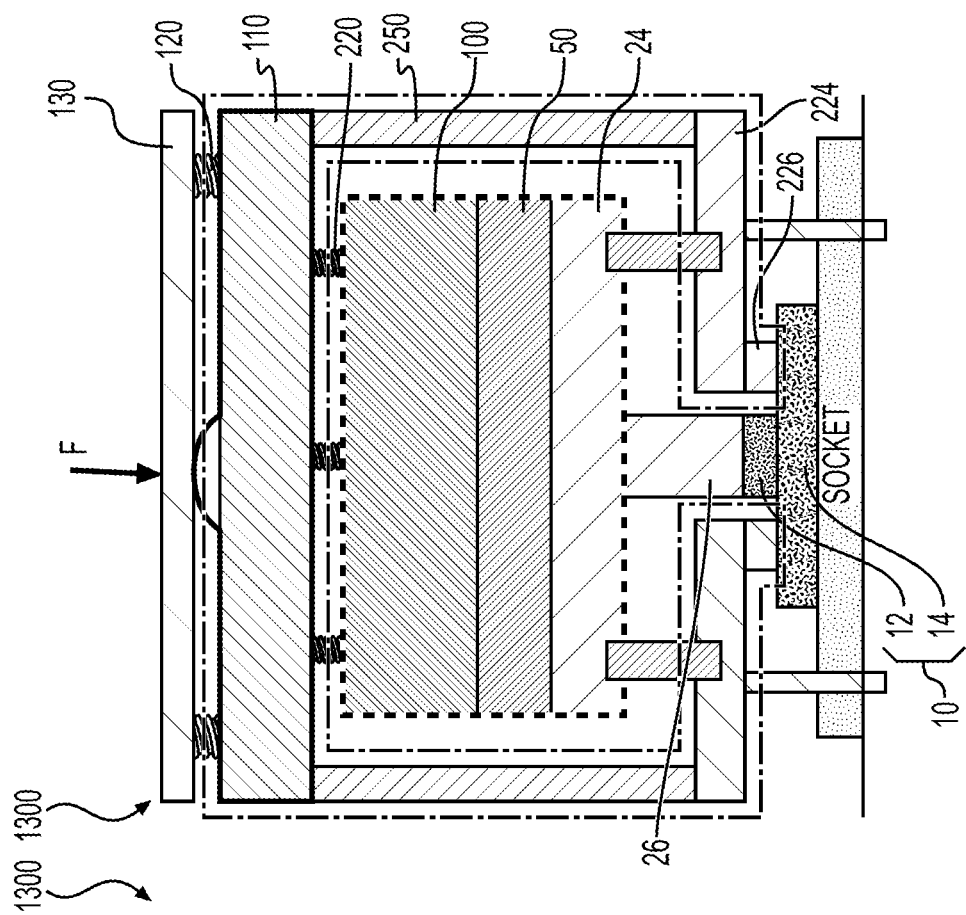
Figure 13B:
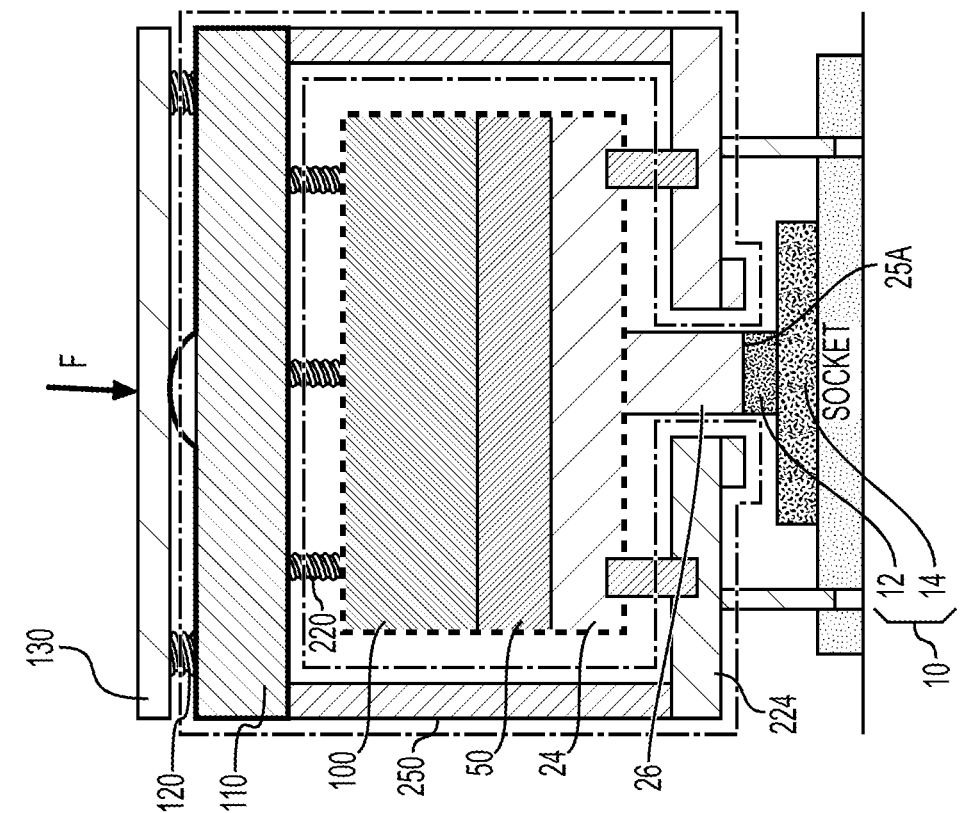

FIGS. 13A-13C are schematic illustrations of testing a DUT using the test head of FIG. 7.

DETAILED DESCRIPTION

The following detailed description is merely illustrative in nature and is not intended to limit the described embodiments. Any embodiment described herein as exemplary is not necessarily to be construed as preferred or advantageous over other embodiments. Descriptions and details of well-known features and techniques may be omitted to avoid obscuring other features. Terms of enumeration such as "top," "bottom," "side," etc. may be used for distinguishing between elements and not necessarily for describing any spatial order. These terms, so used, are interchangeable under appropriate circumstances. For example, a surface described as being the top surface of a component may, in some orientations of the component, be the bottom surface, etc. In the interest of conciseness, conventional techniques, structures, and principles known by those skilled in the art may not be described herein, including, for example, standard test methods and principles of IC devices. In the following description, specific embodiments are described to provide an understanding of the current disclosure. It should be noted that the current disclosure may be practiced without all the described features or aspects. Further, the described embodiments may be incorporated into other devices and/or systems.

Figure 1:
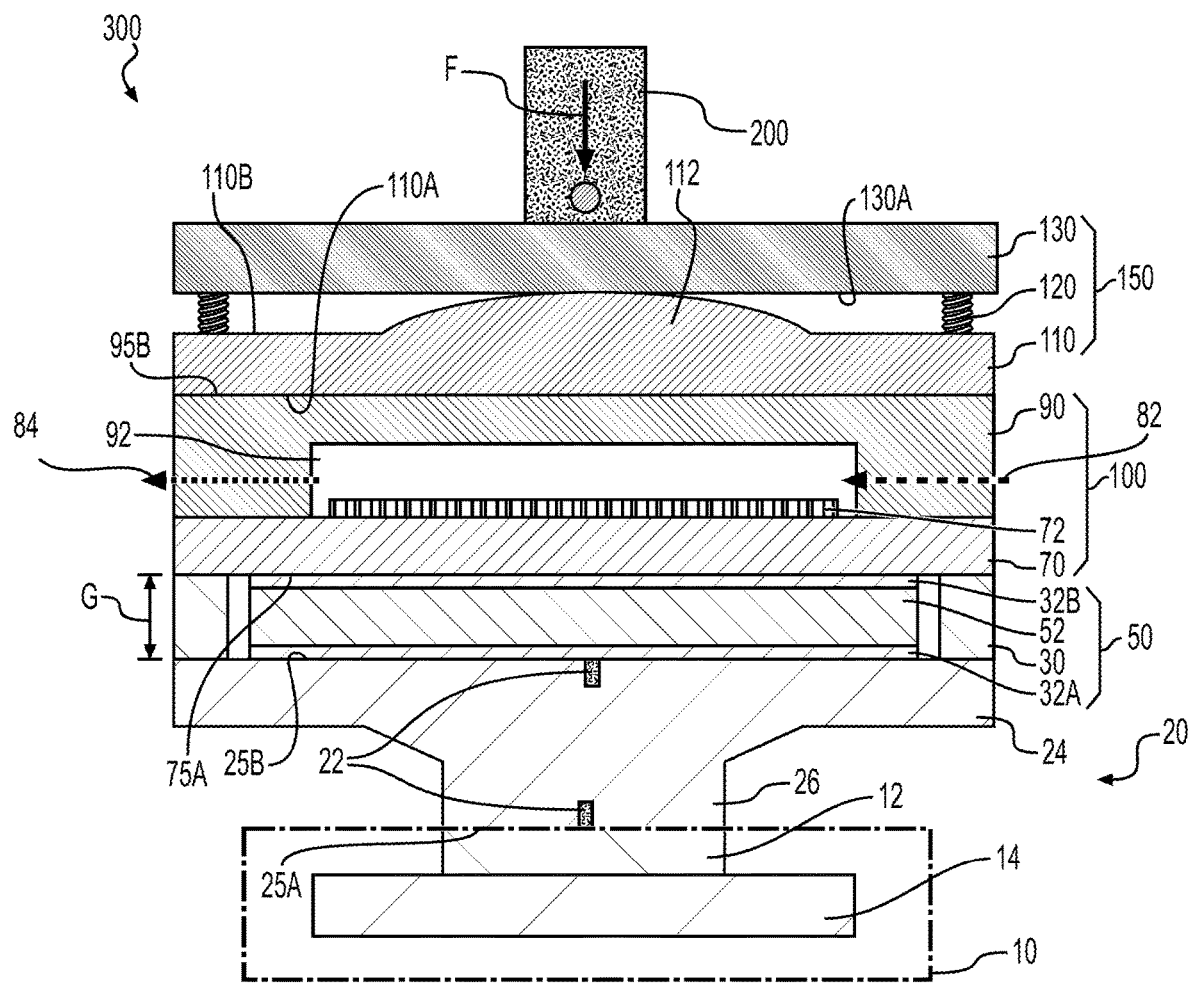
FIG. 1 is a cross-sectional schematic illustration of an exemplary thermal test head of the current disclosure.

FIG. 1 is a schematic illustration of an exemplary thermal test head (also referred to herein as test head) 300 of the current disclosure. Test head 300 includes a DUT contact assembly 20 coupled to a fluid block assembly 100 with a thermal control assembly 50 positioned in between. When test head 300 is in use, a die-contact member 24 of the contact assembly 20 is placed in thermal contact with the surface of a DUT 10 to transfer heat between the DUT 10 and the contact assembly 20. As would be known to persons skilled in the art, the DUT 10 may include an integrated circuit die 12 attached to a substrate 14. In some embodiments, during a test, the substrate 14 may be mounted on a socket (see, for example, FIG. 13A) that is electrically connected to test equipment. In some embodiments, as illustrated in FIG. 1, die-contact member 24 of contact assembly 20 includes a pedestal 26 that is placed in contact with (e.g., pressed against) the top surface of the die 12 such that the pedestal 26 is in good heat transfer relationship with the die 12. For example, as illustrated in FIG. 1, the bottom surface 25A of the pedestal 26 is placed in contact with the top surface of the die 12. In some embodiments, a suitable thermal interface material (such as, for example, thermal grease, thermal foil, etc.) may be positioned between the mating surfaces of the pedestal 26 and the die 12 to reduce interfacial thermal resistance and improve heat transfer between the mating surfaces. As known to persons skilled in the art, in some applications, some of the thermal interface material may squeeze out from between the mating surfaces to bring regions of the mating surfaces into direct contact. That is, in some cases, the bottom surface 25A (or portions thereof) of the pedestal 26 may not necessarily be in direct physical contact with the die surface. Instead, these surfaces (or portions thereof) may be in thermal contact via the thermal interface material. Die-contact member 24 may include one or more temperature sensors 22 to monitor the temperature of the DUT 10 during testing. Although two temperature sensors 22 are illustrated in FIG. 1, in general, contact assembly 20 may include any number of temperature sensors 22, and these sensors may be disposed at any location in contact assembly 20 (e.g., in die-contact member 24 or in other components). In some embodiments, temperature sensors 22 may be adapted to measure temperatures between a range of, for example, −70° C. to 500° C. Although not illustrated in FIG. 1, wiring extending through the die-contact member 24 may connect the temperature sensors 22 to test equipment. In some embodiments, to measure the temperature of the die 12 accurately, a temperature sensor 22 may be provided at, or proximate, the bottom surface 25A of the pedestal 26.

In some embodiments, the pedestal 26 may be an integral part of die-contact member 24. For example, the pedestal 26 may be a block-like projection that extends away from the bottom surface of the die-contact member 24. In some embodiments, the pedestal 26 may be a separate component that is attached to the bottom surface of the die-contact member 24. Die-contact member 24 and pedestal 26 may be formed of any thermally conductive material. In some embodiments, the pedestal 26 and the die-contact member 24 may be formed of, or include, one or more of copper, silver, gold, zinc, aluminum nitride, silicon carbide, aluminum, etc. In some embodiments, the pedestal 26 and the die-contact member 24 may be formed of copper.

With continuing reference to FIG. 1, the thermal control assembly 50, positioned between the contact assembly 20 and the fluid block assembly 100, may include a thermo-electric cooler/heater that assists in maintaining the temperature of the DUT 10 at a desired temperature. The thermal control assembly 50 may include a Peltier device 52 that is in thermal contact with the die-contact member 24 of contact assembly 20 and the fluid block assembly 100. As known to persons skilled in the art, when a DC electric current flows through the Peltier device 52, heat is transferred from one side (e.g., a first side) of the Peltier device 52 to the other (e.g., a second side), so that the first side gets cooler while the second side gets hotter. In some embodiments, as illustrated in FIG. 1, Peltier device 52 is positioned (e.g., sandwiched) between the top surface 25B of the die-contact member 24 and the bottom surface 75A of the fluid block assembly 100. Peltier device 52 controls the amount and direction of heat flow between the die-contact member 24 and the fluid block assembly 100 based on the desired temperature (e.g., prescribed temperature of the test) of the DUT 10 and its actual temperature, for example, measured by temperature sensors 22. When the desired DUT temperature is lower than its actual temperature, the direction of current flow through the Peltier device 52 is controlled to transfer heat from the top surface 25B of the die-contact member 24 to the bottom surface 75A of the fluid block assembly 100 (i.e., to remove heat from the DUT 10). Similarly, when the desired DUT temperature is higher than its actual temperature, the direction of current in the Peltier device 52 is reversed to transfer heat from the fluid block assembly 100 to the die-contact member 24.

To improve thermal coupling between the thermal control assembly 50, the die-contact member 24, and the fluid block assembly 100, a thermal interface material (TIM 32) may be positioned between the mating surfaces of these components. For example, as illustrated in FIG. 1, a first TIM 32A may be positioned between the mating surfaces of the Peltier device 52 and the die-contact member 24. And, a second TIM 32B may be positioned between the mating surfaces of the Peltier device 52 and the fluid block assembly 100. TIM 32A may be the same material as, or different material from, TIM 32B. TIMs 32A and 32B may be soft cushion-like materials that, for example, fill the surface irregularities on the mating surfaces of the components and improve heat transfer between these surfaces. Any now-known or later-developed thermal interface material may be used as TIMs 32A and 32B. In some embodiments, one or more of thermal grease, thermal foil, thermal adhesive, thermal gap filler, thermal tape, phase-change material, thermally conductive pad, etc. may be used as TIMs 32A and 32B. For simplicity, in the discussion below, first TIM 32A and second TIM 32B will simply be referred to as TIM 32.

Figure 4:
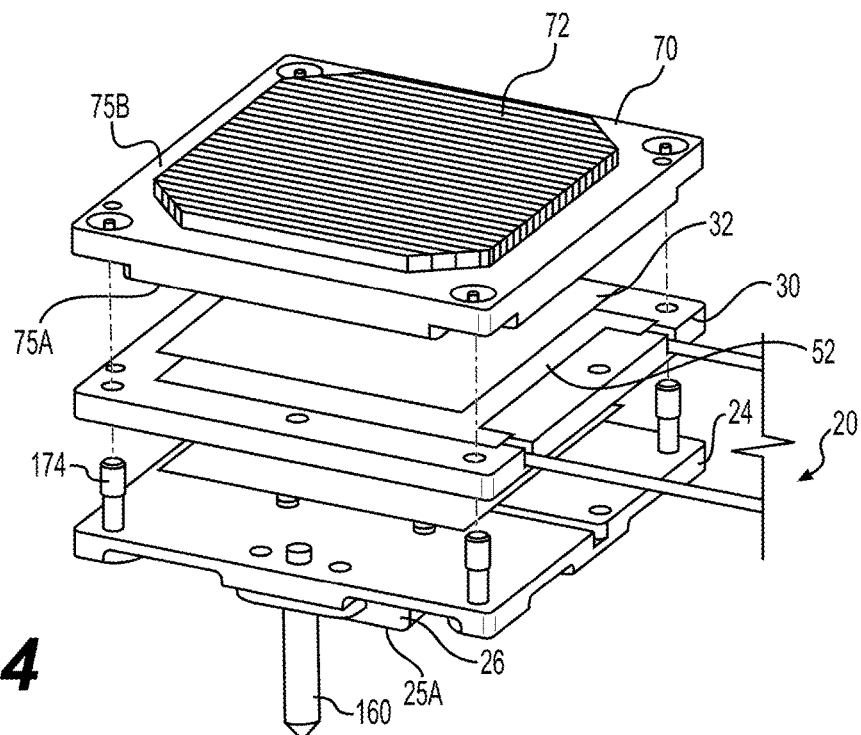
FIG. 4 is an exploded view of another portion of the thermal test head of FIG. 1.
Figure 5A:
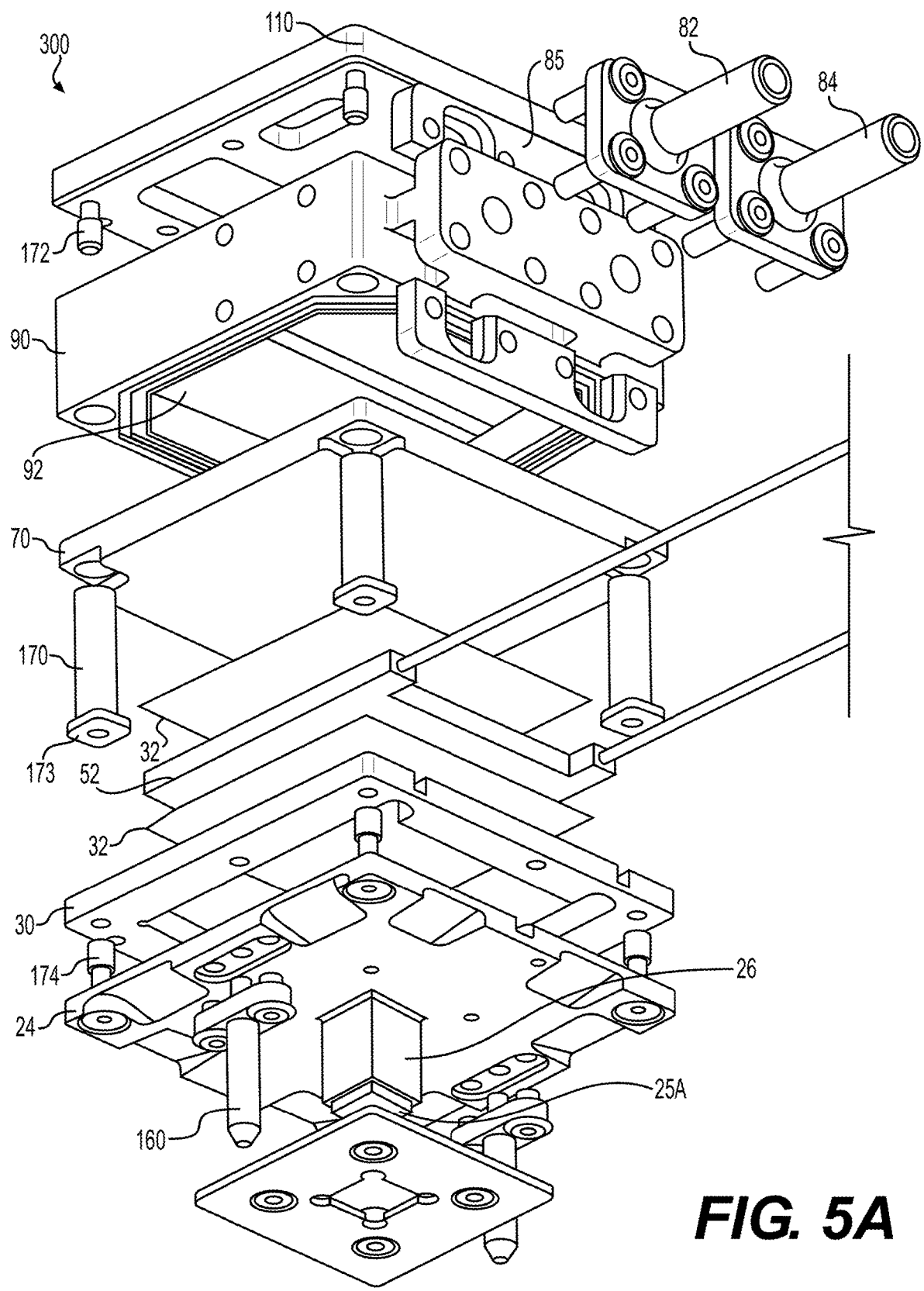
FIG. 5A is an exploded bottom view of the thermal test head of FIG. 1.
Figure 5B:
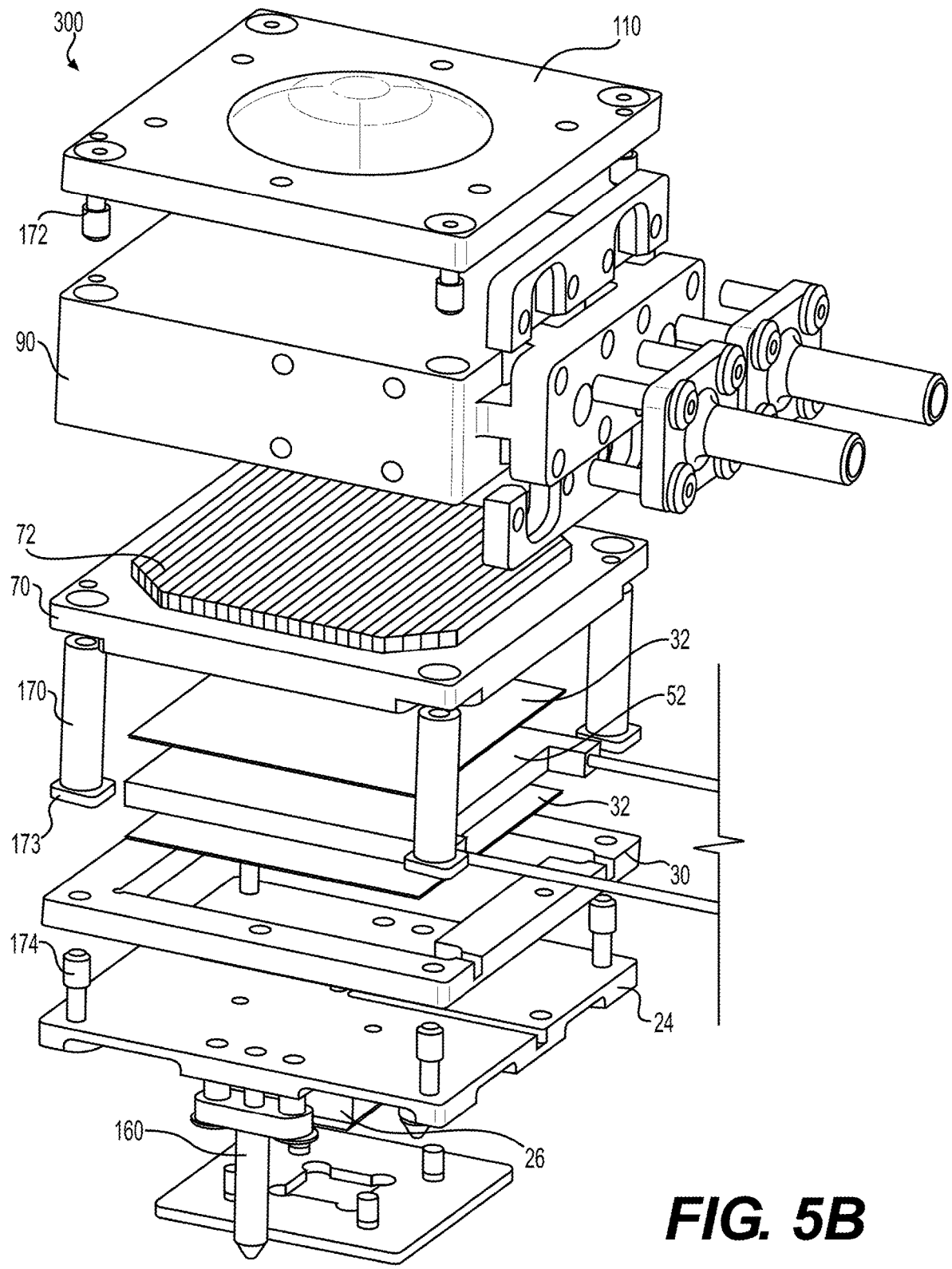
FIG. 5B is an exploded top view of the thermal test head of FIG. 1.

In addition to Peltier device 52, the thermal control assembly 50 may include a spacer 30 positioned between the top surface 25B of the die-contact member 24 and the bottom surface 75A of the fluid block assembly 100. In some embodiments, spacer 30 may be an annular shaped component with a central opening. For example, as best seen in FIGS. 5A and 5B, in some embodiments, spacer 30 may be shaped like a square or rectangular annulus with a square or rectangular shaped central opening. And, the Peltier device 52 may be positioned in the central opening of the spacer 30 with its electrical leads extending through channels in the body of the spacer 30 (see, for example, FIG. 4). In some embodiments, as illustrated in FIG. 4, the size (e.g., length and width) of the central opening may be substantially equal to the size of the Peltier device 52 so that the Peltier device 52 fits snugly in the central opening of the spacer 30. However, this is not a requirement. And, as illustrated in FIG. 1, in some embodiments, the size of the central opening of the spacer 30 may be larger than the size of the Peltier device 52.

In general, the height of the spacer 30 may control the vertical spacing (the gap G) between the top surface 25B of the die-contact member 24 and the bottom surface 75A of the fluid block assembly 100. That is, the top surface of spacer 30 may physically contact the bottom surface 75A of the fluid block assembly 100, and the bottom surface of spacer 30 may physically contact the top surface 25B of the die-contact member 24. In some embodiments, before assembly of the test head 300, the TIM 32 on either side of Peltier device 52 may have a height of, for example, 3 mils (1 mil=0.0254 mm). During assembly, the fluid block assembly 100 and the contact assembly 20 may be pressed together such that each TIM 32 (i.e., TIM 32A and TIM 32B) compresses to a height of, for example, 1.5 mils with the spacer 30 making physical contact with the fluid block assembly 100 and the die-contact member 24. That is, after test head 300 is assembled, the spacer 30 is in physical contact with the bottom surface 75A of the fluid block assembly 100 and the top surface 25B of the die-contact member 24. In this configuration, the Peltier device 52 is in thermal contact with these surfaces through the TIMs 32. The vertical gap G between the bottom surface 75A of the fluid block assembly 100 and the top surface 25B of the die-contact member 24 may be the height of the spacer 30 (which may be substantially equal to the height of the Peltier device 52 plus the height of the TIMs 32 on either side of the Peltier device 52). Although the TIMs 32 of an assembled test head are described as being compressed (or controlled compressed), in some embodiments, these TIMs 32 may also be uncompressed.

In general, the spacer 30 may be formed of a relatively stiff material such that, when a force F (see FIG. 1) is applied on the DUT 10 using the test head 300, the force is transferred from the fluid block assembly 100 to the die-contact member 24 (of contact assembly 20) via the spacer 30. That is, when a force is applied on the DUT 10 using the test head 300, the spacer 30 transfers substantially all of the force from the fluid block assembly 100 to the die-contact member 24 and reduces impact of the force on the TIM 32. In some embodiments, the spacer 30 may be formed of a relatively low thermal conductivity material such that the Peltier device 52 transfers substantially all the heat between the die-contact member 24 and the fluid block assembly 100. In general, the spacer 30 may formed of any material having the above-described characteristics (e.g., low thermal conductivity and high stiffness). In some embodiments, the spacer 30 may include materials, such as, for example, plastics, ceramics, etc. Although not a requirement, in some embodiments, the spacer 30 may be formed of an engineering plastic, such as, for example, Semitron® Semiconductor Grade plastic.

It should be noted that the annular shape of spacer 30 (illustrated in, for example, FIGS. 5A and 5B) is not a requirement. In general, the spacer 30 may have any suitable shape to control the vertical spacing, and transfer force, between the fluid block assembly 100 and the die-contact member 24. In some embodiments, the spacer 30 may not be a single component. Instead, the spacer 30 may comprise multiple components, arranged at least partially around the Peltier device 52, that collectively serve as a standoff between the die-contact member 24 and the fluid block assembly 100. In some embodiments, the spacer 30 may not extend entirely around the Peltier device 52. Instead, spacer 30 may only extend around two or three sides (e.g., opposite sides, adjacent sides, etc.) of the Peltier device 52. That is, in some embodiments, the spacer 30 may have an L-shaped or a U-shaped (or C-shaped) configuration. In some embodiments, the multiple spacer elements may be arranged on different sides of Peltier device 52 to collectively define different configurations (e.g., elongated elements parallel to one another, etc.).

Figure 2:
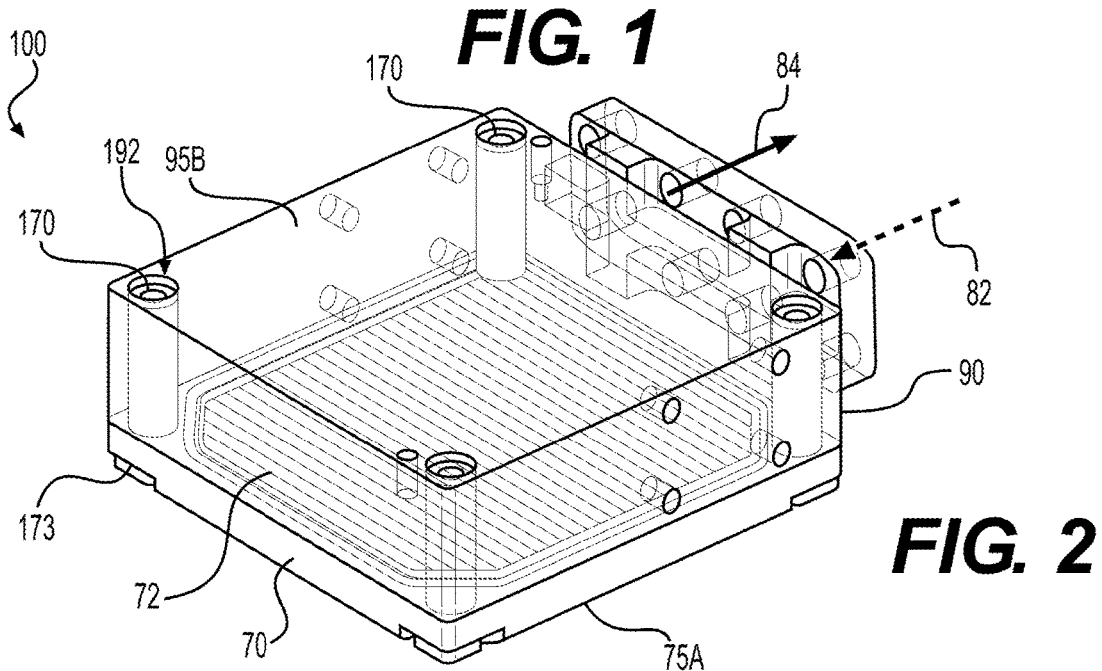
FIG. 2 is a perspective view of an exemplary heat exchanger assembly of the thermal test head of FIG. 1.
Figure 3:
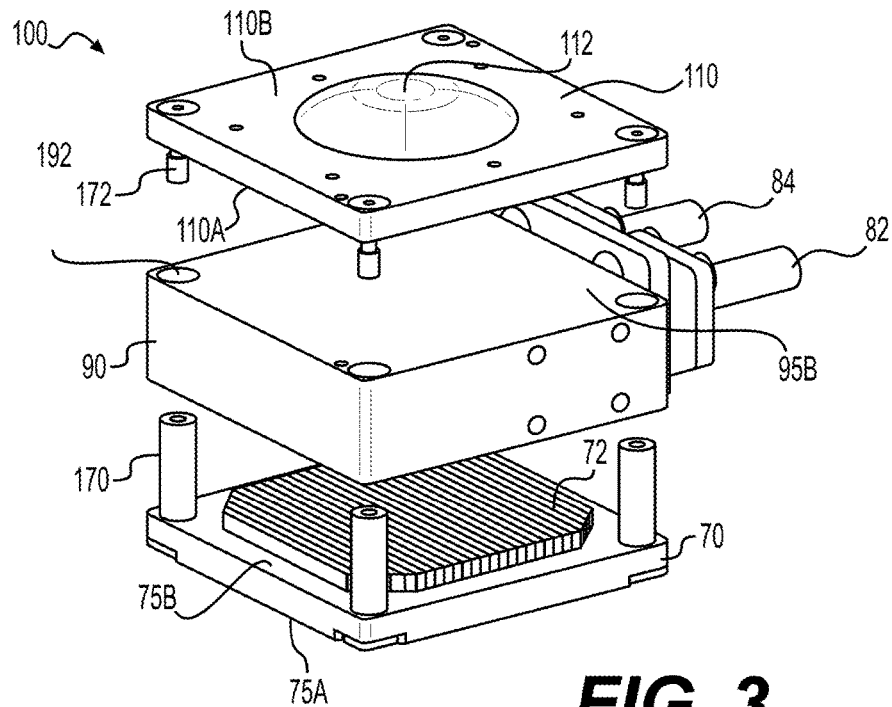
FIG. 3 is an exploded view of a portion of the thermal test head of FIG. 1.

Fluid block assembly 100 is a fluid circulating assembly that removes thermal energy from, or provides thermal energy to, the test head 300. When it is desired to cool the DUT 10, the fluid block assembly 100 removes the heat transferred by the Peltier device 52 from the top surface 25B of the die-contact member 24 to the bottom surface 75A of the fluid block assembly 100. Similarly, when it is desired to increase the temperature of the DUT 10, the fluid block assembly 100 provides the thermal energy that the Peltier device 52 transfers to the die-contact member 24. Any type of device suitable for its purpose may be used as fluid block assembly 100. In some embodiments, the fluid block assembly 100 may include a micro-fin heat exchanger. As best seen in FIG. 1, in some embodiments, fluid block assembly 100 includes a micro-finned cold plate 70 and a manifold 90. As best seen in FIGS. 3 and 4, the cold plate 70 may include a solid body having bottom and top surfaces 75A, 75B. As explained previously, the bottom surface 75A of the cold plate 70 is in thermal contact with the Peltier device 52 (via TIM 32) and in physical contact with the top surface of the spacer 30. The top surface 75B of the cold plate 70 includes a plurality of micro-fins 72 (see FIG. 3). The micro-fins 72 increase the rate of heat transfer from the top surface 75B by increasing its surface area. In some embodiments, micro-fins 72 may include multiple plate-like or pin-like projections protruding from the top surface 75B. As best seen in FIG. 1, manifold 90 may be a housing that defines a hollow cavity 92 therein. Manifold 90 is positioned (or assembled) on the cold plate 70 such that the micro-fins 72 are positioned within (or enclosed by) the cavity 92. Manifold 90 includes a fluid inlet 82 that directs a fluid into the cavity 92 and a fluid outlet 84 that directs the fluid out of the cavity 92. Although not a requirement, in some embodiments, the fluid inlet 84 and the fluid outlet 84 are formed on the same side of the manifold 90 (see FIGS. 2, 3, 5A, and 5B). In some embodiments (e.g., when the manifold 90 is made of a relatively soft material such as plastic), the fluid inlet 84 and fluid outlet 84 may be tube adapters fastened (e.g., using screws) to a port nut 85 that is coupled to the manifold 90 (see FIG. 5B).

Although not visible in the figures, the fluid inlet and outlet 82, 84 may be fluidly coupled to the cavity 92 of manifold 90 via vertically extending passages that extend through the manifold 90. During use, fluid entering the manifold 90 through the fluid inlet 82 enters the cavity 92 above the micro-fins 72. As the fluid flows over the micro-fins 72, heat transfer occurs between the micro-fins 72 and the fluid. The fluid then exits the manifold 90 through the fluid outlet 84. In general, any liquid or gaseous fluid may be circulated through the manifold 90. In some embodiments, a liquid (e.g., water, water mixed with alcohol, etc.) may be used as the fluid. When Peltier device 52 is operating to remove heat from (or cool) the DUT 10, the fluid in cavity 92 removes heat from the cold plate 70. In such situations, the fluid leaving the manifold 90 (via the fluid outlet 84) may be warmer than the fluid entering the manifold 90 (via the fluid inlet 82). Conversely, when Peltier device 52 is operating to heat the DUT 10, the fluid entering the manifold 90 may be warmer than the fluid exiting the manifold 90.

In general, the components of the fluid block assembly 100 may be formed of any suitable material(s). In some embodiments, the cold plate 70 may be formed of a thermally conductive material (such as, for example, copper, aluminum, etc.) and the manifold 90 may be formed of a plastic material (such as, for example, PEEK (Polyether ether ketone)). In some embodiments, the cold plate 70 may be formed of a thermally conductive material, but the manifold 90 may be formed of a plastic material (e.g., PEEK).

Figure 6A:
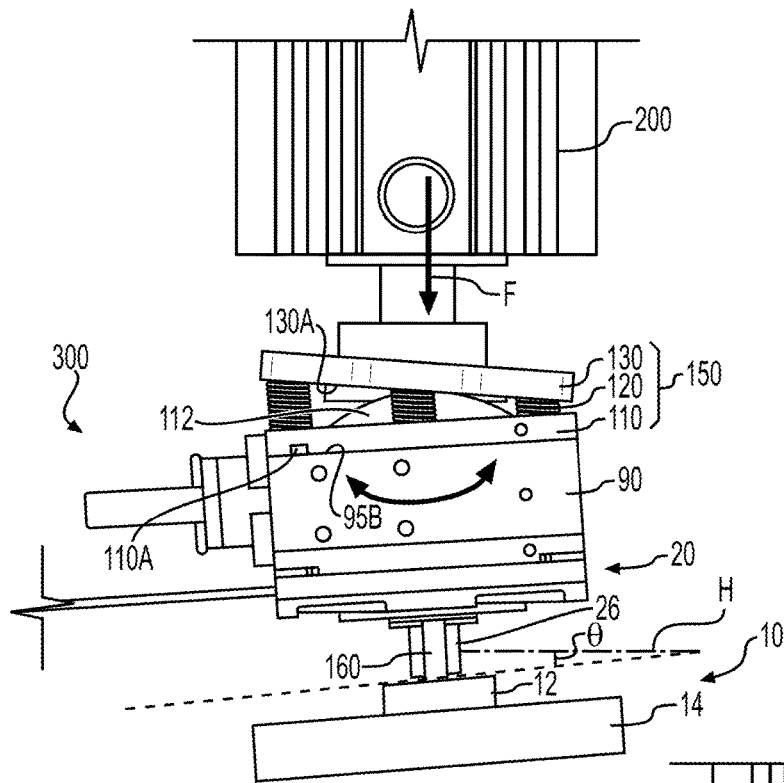
FIGS. 6A and 6B are schematic illustrations of testing a DUT using the test head of FIG. 1.
Figure 6B:
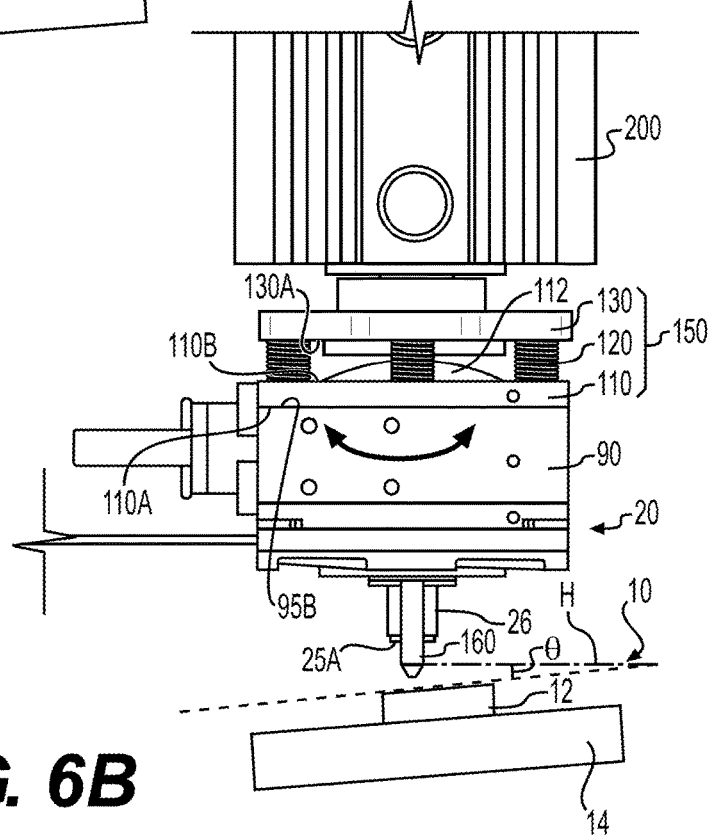

To ensure that the DUT 10 is effectively heated and cooled by the test head 300 during a test, it is desirable to maintain good thermal coupling between the test head 300 and the DUT 10. With reference to FIG. 1, to increase thermal coupling between the pedestal 26 of the die-contact member 24 and the die 12 of the DUT 10 during a test, a compressive force F is applied on the test head 300 to press the bottom surface 25A of the pedestal 26 against the surface of the die 12. Due to part-to-part variations (and/or non-uniformities in the DUT 10 support structure), there may be variations in the angular alignment of the die surfaces of different DUTs 10 (that will be tested using the test head 300) with respect to a common horizontal plane H (see FIG. 6A). For optimal thermal coupling between the bottom surface 25A of the pedestal 26 and the top surface of the die 12, these two surfaces are preferably parallel (or aligned) when they are in contact. To ensure that these two surfaces align (or become parallel) when they engage, test head 300 includes an inclination-adjustment device (herein after referred to as an alignment mechanism 150) that swivels or rotates the test head 300 such that the bottom surface 25A of the pedestal 26 becomes parallel to the surface of the die 12 when they contact. That is, the alignment mechanism 150 is configured to vary the inclination of the bottom surface 25A of the pedestal 26 to match the inclination of the die surface when they contact. With reference to FIGS. 6A and 6B, in some embodiments, the alignment mechanism 150 includes an alignment plate 110 coupled to a lock plate 130 via multiple springs 120 positioned between the two plates 110, 130. The alignment plate 110 is coupled to the top surface 95B of the manifold 90 of the test head 300. And, the lock plate 130 is coupled to a cylinder head 200. The cylinder head 200 is configured to position the test head 300 above a DUT 10, lower the test head 300 to bring the pedestal 26 of test head 300 into contact with the die 12 of DUT 10, and apply the compressive force F on the DUT 10 during a test. The contact assembly 20 may include one or more locating pins 160 that engage with a corresponding feature (e.g., locating hole) on the DUT 10 (or on a socket that DUT 10 is mounted on) to align the pedestal 26 with the die 12. After completing the test, the cylinder head 200 lifts the test head 300 from the DUT 10 and positions it above another DUT 10 for testing.

In some embodiments, as best seen in FIG. 1 (see also FIGS. 6A and 6B), the bottom surface 110A of the alignment plate 110 is in direct contact with the top surface 95B of the manifold 90. And, the top surface 110B of the alignment plate 110 includes a centrally located convex-shaped projection 112 that faces the bottom surface 130A of the lock plate 130. With additional reference to FIGS. 6A and 6B, the multiple springs 120 of the alignment mechanism 150 are positioned around the convex-shaped projection 112 to bias the alignment plate 110 and lock plate 130 away from each other. That is, when the test head 300 is not in use, the springs 120 maintain physical separation between the top surface 110B of the alignment plate 110 and the bottom surface 130A of the lock plate 130 (see (FIG. 6B). When the cylinder head 200 pushes the test head 300 against the surface of the die 12, the springs 120 compress until a portion of the bottom surface 130A of the lock plate 130 contacts (or bottoms out on) the convex-shaped projection 112 on the top surface 110B of the alignment plate 110 (see FIGS. 1 and 6A). With reference to FIG. 6A, if the surface of the die 12 is not aligned parallel to the bottom surface 25A of the pedestal 26 when they engage, the multiple springs 120 (between the lock plate 130 and the alignment plate 110) compress by different amounts to rotate the test head 300 such that the bottom surface 25A becomes parallel to the die surface. Thus, the alignment mechanism 150 ensures that the mating surfaces of the test head 300 and the DUT 10 engage in a parallel manner. It should be noted that although a particular type of inclination-adjustment device (or alignment mechanism 150) is described, any mechanism that is configured to vary the inclination of the test head 300 such that the inclination of the contact surface 25A matches the inclination of the die surface when they make contact can be used. For example, in some embodiments of test heads, one or more ball and socket joints, etc. may be used as the inclination-adjustment device.

In general, the components of the test head 300 may be coupled together in any manner. In some embodiments, as best seen in FIG. 2, bushes 170 with internal screw threads may be positioned in through-hole cavities 192 of manifold 90. These bushes 170 may extend through aligned cavities on the cold plate 70 and the manifold 90. A bush-head 173 with a larger cross-sectional area than the cavity on the cold plate 70 may engage with the bottom surface of the cold plate 70 and constrain the bushes 170 in the cavities 192 (see, for example, FIGS. 2 and 3). A set of screws 174 extending through aligned cavities in the die-contact member 24 and the spacer 30 engages with internal screw threads on the bottom-side of the bushes 170 to couple the die-contact member 24 and the spacer 30 to the bottom of the cold plate 70 (see, for example, FIGS. 5A and 5B). And, shoulder screws 172 that extend through cavities on the alignment plate 110 engage with the internal screw treads on the top side of the bushes 170 to couple the alignment plate 110 to the top of the manifold 90. It should be noted that the above-described attachment mechanism is only exemplary and the components of the test head 300 may be coupled together in any suitable manner.

As schematically illustrated in FIGS. 6A and 6B, during a test, the cylinder head 200 lowers the test head 300 to bring the bottom surface 25A of the pedestal 26 of die-contact member 24 into contact with the surface of a die 12 to be tested. When the surfaces are in contact, the cylinder head 200 applies a compressive force F on the test head 300 to increase the thermal coupling between the die-contact member 24 and the die 12. After the test is complete, the cylinder head 200 lifts the test head 300 from the DUT surface and positions it above another DUT to be tested. As illustrated in FIGS. 6A and 6B, contact assembly 20 includes locating pins 160 (see FIGS. 5A-6B) that engage with a corresponding feature on the DUT (e.g., a recess in the socket that supports the DUT 10, see FIG. 13A) to align the test head 300 with the DUT 10. As best seen in FIG. 6A, when the die-contact member 24 is in contact with a DUT 10 that is inclined with respect to the horizontal plane H, the alignment mechanism 150 allows the test head 300 to rotate such that the contact surface of the die-contact member 24 is parallel to the DUT surface. The multiple springs 120 that connect the lock plate 130 to the alignment plate 110 allow these two plates to remain non-parallel when the compressive force F is applied by the test head 300 on the inclined DUT 10. When the cylinder head 200 lifts the test head 300 from the DUT surface after the test, the springs 120 restore the parallel alignment between the lock plate 130 and the alignment plate 110.

With reference to FIG. 1, when the compressive force F is applied by the cylinder head 200 on the test head 300, any resulting compressive force on the TIMs 32 (at the interface between the fluid block assembly 100 and the Peltier device 52 and the interface between the Peltier device 52 and the die-contact member 24) improve the thermal coupling between the components of the test head 300. At the same time, the support provided by the spacer 30 positioned between the die-contact member 24 and the fluid block assembly 100 allows force to be transmitted between these components without excessive compressive force being applied on the TIMs 32. In the absence of the spacer 30, repeated application of large compressive forces on the TIMs 32 may, in some cases, cause the material of the TIMs 32 to be squeezed out from the interfaces to form voids (when the compressive force is removed). These voids may increase the thermal resistance of the test head 300. Thus, the additional load path provided by the spacer 30 prevents the increase in thermal resistance of the test head 300 during repeated usage.

In the embodiment of the test head 300 described above (e.g., with reference to FIG. 1), substantially all the compressive force F applied by the cylinder head 200 on the test head 300 is applied to the surface of die 12 (of DUT 10) via the die-contact member 24 of contact assembly 20. In some embodiments, the contact assembly 20 may also include components that additionally apply a compressive force on another portion (e.g., substrate 14) of the DUT 10 during a test. As would be recognized by people skilled in the art, the die 12 and substrate 14 (of DUT 10) have different coefficients of thermal expansions (CTE), and therefore, expand and contract by different amounts in response to a temperature change. Since the die 12 and the substrate 14 are attached together (e.g., using a solder material), the difference in thermal expansion between them may cause the DUT 10 to warp when heated or cooled. Warpage of the DUT 10 causes curvature of the surfaces of the die and the substrate. Thus, during testing, the surfaces of the die and the substrate may be curved. Applying a compressive force on the substrate during testing may assist in the testing of warped DUTs.

Figure 8A:
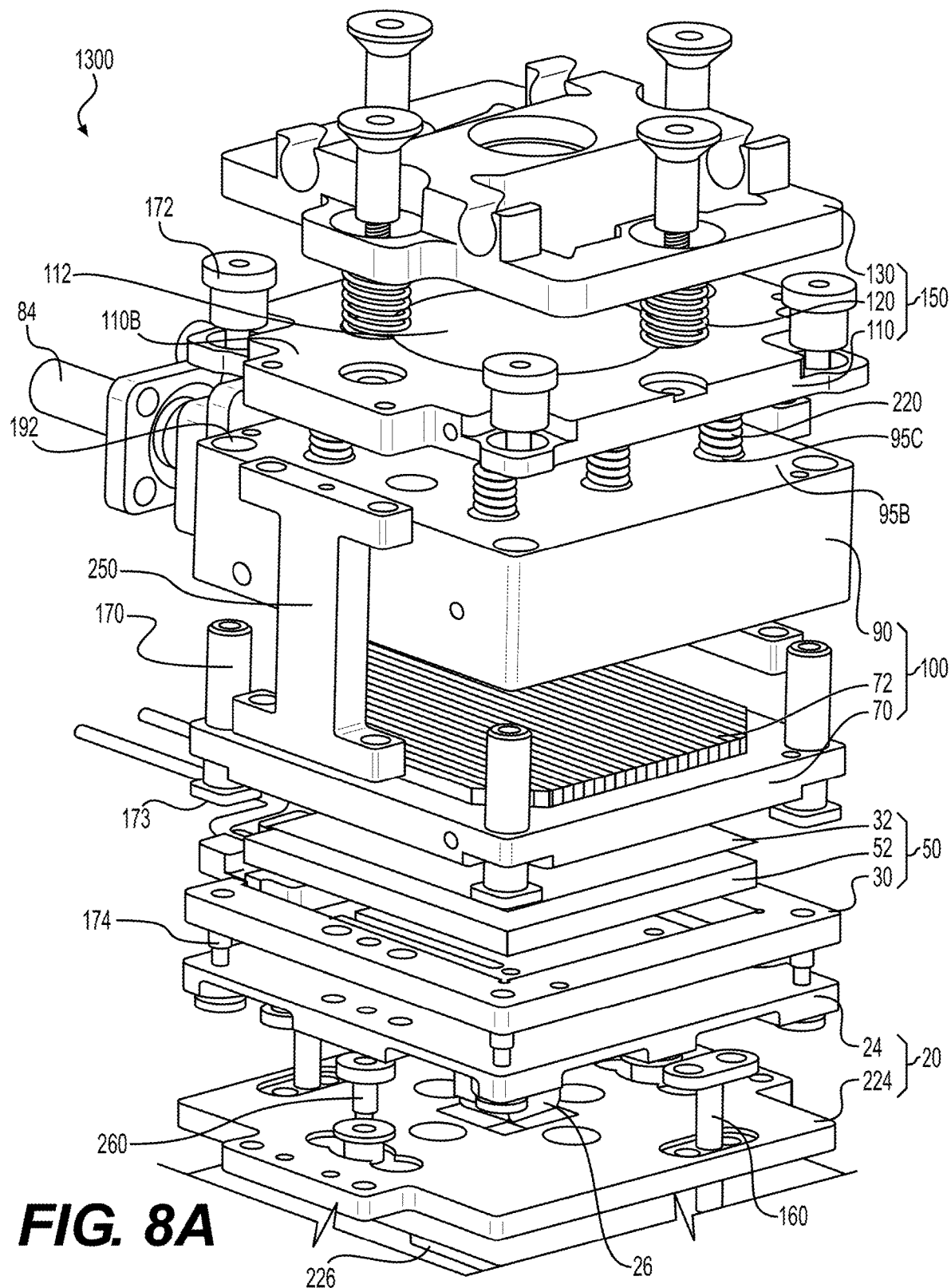
FIG. 8A is an exploded view of the thermal test head of FIG. 7.
Figure 8B:
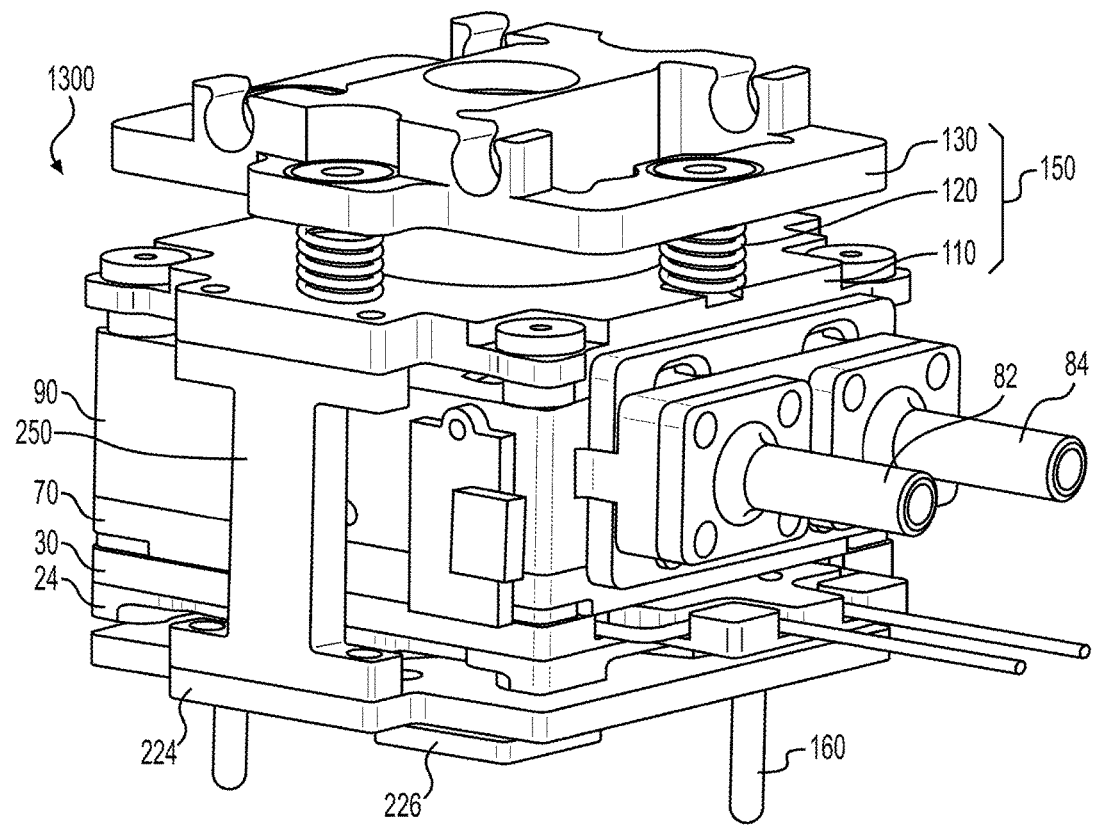
FIG. 8B is an assembled view of the thermal test head of FIG. 7.

FIG. 7 is the schematic illustration of an embodiment of a test head 1300 that applies a compressive force on the substrate 14 (in addition to a compressive force on the die 12) of DUT 10. FIG. 8A shows an exploded view of test head 1300 and FIG. 8B shows an assembled view of the test head 1300. In the discussion below, reference will be made to FIGS. 7-8B. As in test head 300 of FIG. 1, test head 1300 of FIG. 7 includes a DUT contact assembly 20 coupled to a fluid block assembly 100 with a thermal control assembly 50 positioned in between. Test head 1300 is coupled to the cylinder head 200 via an alignment mechanism 150 that is configured to rotate the test head 1300 to match the angular alignment of the DUT 10. The components of test head 1300 that are like the corresponding components of test head 300 are similarly numbered. The description of these components made with respect to test head 300 is also applicable with respect to test head 1300, and vice versa.

Figure 9:
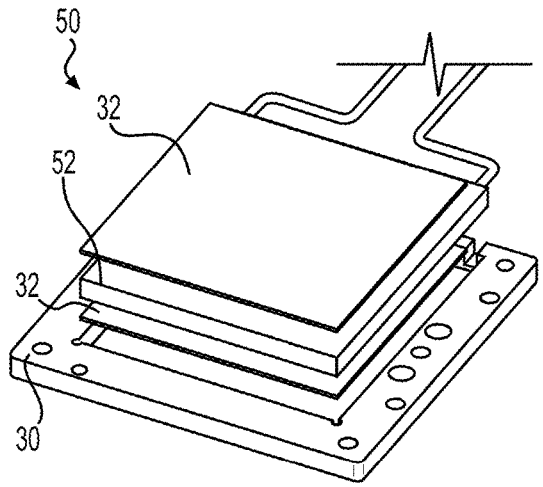
FIG. 9 is an exploded view of the thermal control assembly of the thermal test head of FIG. 7.

Thermal control assembly 50 of test head 1300 includes a Peltier device 52 with TIMs 32 positioned on opposite sides of the Peltier device 52, and a spacer 30 positioned at least partially around the Peltier device 52. FIG. 9 illustrates an exploded view of the thermal component assembly 50 in an exemplary embodiment. The Peltier device 52 is in thermal contact with the contact assembly 20 and the fluid block assembly 100 via the TIMs 32 positioned on either side of the Peltier device 52. The spacer 30, which is in physical contact with the top surface of the die-contact block 24 of contact assembly 20 and the bottom surface of the fluid block assembly 100, controls the vertical spacing between the fluid block assembly 100 and the contact assembly 20. As in test head 300 of FIG. 1, when a compressive force is applied to the test head 1300, the spacer 30 transfers the force from the fluid block assembly 100 to the die-contact block 24. The bottom surface 25A of the pedestal 26 (of the die-contact member 24), that is in contact with the die 12 of DUT 10, applies the compressive force on the die 12. As explained with reference test head 300, since the spacer 30 transfers force from the fluid block assembly 100 to the die-contact member 24, impact of the force on the TIMs 32 is reduced. As also explained previously, the shape and configuration of spacer 30 illustrated in the figures is only exemplary, and in general, spacer 30 may have any suitable shape.

Figure 10:
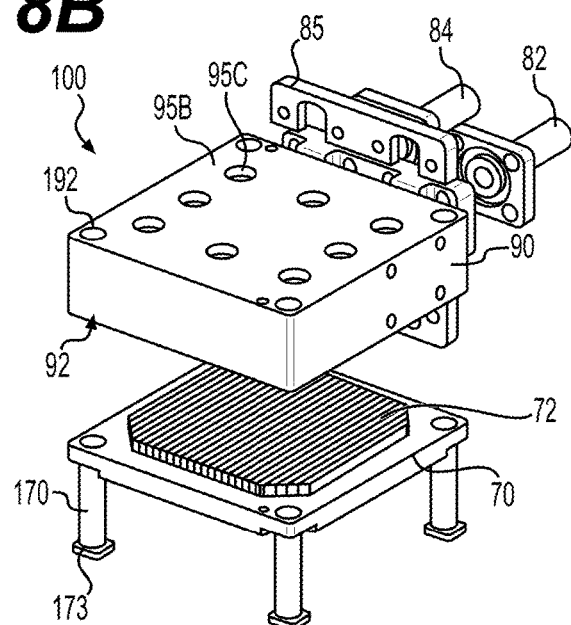
FIG. 10 is an exploded view of the fluid block assembly of the thermal test head of FIG. 7.

Fluid block assembly 100 of test head 1300 may also be a fluid circulating heat exchanger. FIG. 10 illustrates an exploded view of the fluid block assembly 100 in an exemplary embodiment. Fluid block assembly 100 includes a cold plate 70 with micro-fins 72 formed on its top surface. A manifold 90 having a cavity 92 is positioned on the cold plate 70 such that the micro-fins 72 are enclosed in the cavity 92. A fluid inlet 82 and a fluid outlet 84 directs a fluid into and out of the cavity 92 for heat transfer with the micro-fins 72. During use, fluid directed into the cavity 92 through the fluid inlet 82 exchanges heat with the micro-fins 72 and exits the manifold 90 through the fluid outlet 84. Although not a requirement, in some embodiments, the fluid inlet 84 and the fluid outlet 84 are formed on the same side of the manifold 90. In some embodiments, the fluid entering the manifold 90 may flow through downwardly extending passages (not shown) in the manifold 90 to enter the cavity 92 above the micro-fins 72. The fluid then flows over the micro-fins 72 and transfers heat with the micro-fins 72. The micro-fins 72 may have any size and shape. In general, the shape, size, and configuration of the micro-fins 72 may be designed to increase the heat transfer of the fluid with the micro-fins 72. The components of the fluid block assembly 100 may be formed of any suitable material(s). In some embodiments, the cold plate 70 may be formed of a thermally conductive material (such as, for example, copper, aluminum, etc.). And, the manifold 90 may be formed of a plastic material (such as, for example, PEEK (Polyether ether ketone)). In some embodiments (e.g., when the manifold 90 is made of plastic), the fluid inlet 82 and fluid outlet 84 may be fluid conduits or tube adapters coupled to the manifold 90 via a metal (e.g., stainless steel) port nut 85.

With reference to FIGS. 8A and 8B, the manifold 90 includes through-hole cavities 192 that are sized to receive bushes 170. These bushes 170 may extend through aligned cavities in the cold plate 70 and cavities 192 in the manifold 90 and may include internal screw threads. A bush-head 173 with a larger cross-sectional area than the cavity on the cold plate 70 may engage with the bottom surface of the cold plate 70 and constrain the bushes 170 in the cavities 192. The screw threads on opposite sides of the bushes 70 may be used to attach underlying and overlying components to the fluid block assembly 100. A set of screws 174 extending through aligned cavities in the die-contact member 24 (of contact assembly 20) and the spacer 30 (of thermal control assembly 50) may engage with internal threads on the bottom-side of the bushes 170 to couple the contact assembly 20 and the thermal control assembly 50 to the bottom of the fluid block assembly 100. And, shoulder screws 172 that extend through cavities on the alignment plate 110 (of alignment mechanism 150) engage with the internal threads on the top side of the bushes 170 to couple the alignment mechanism 150 to the top of the fluid block assembly 100.

Similar to the inclination-adjustment device, or the alignment mechanism 150 of test head 300, the alignment mechanism 150 of test head 1300 is also configured to rotate the test head 1300 such that the bottom surface 25A of the pedestal 26 (of die-contact member 24) that contacts the die 12 during a test becomes parallel to the surface of the die 12 as they engage. FIG. 11 illustrates an exploded view of the alignment mechanism 150 of test head 1300 in an exemplary embodiment. Alignment mechanism 150 includes an alignment plate 110 coupled to a lock plate 130 with multiple springs 120 positioned between the two plates 110, 130. As in test head 300, the lock plate 130 is coupled to a cylinder head 200 and the alignment plate 110 is coupled to the top surface 95B of the manifold 90 (see FIG. 7). In test head 300, shoulder screws 172 fasten the alignment plate 110 to the manifold such that the bottom surface 110A of the alignment plate 110 is in direct physical contact with the top surface 95A of the manifold 90 (see FIGS. 1 and 5B). In test head 1300, multiple springs 220 are positioned between the manifold 90 and the alignment plate 110 to bias the bottom surface 110A of the alignment plate 110 away from the top surface 95B of the manifold 90. Cavities 95C formed on the top surface 95C of the manifold 90 locate these springs 220 at suitable locations between these surfaces (see FIGS. 8B and 10). The top surface 110B of the alignment plate 110 includes a centrally located convex-shaped projection 112 that faces the bottom surface 130A of the lock plate 130. Springs 120 of the alignment mechanism 150 are positioned around the convex-shaped projection 112 to bias the top surface 110B of the alignment plate 110 and bottom surface 130A of the lock plate 130 away from each other. These springs 120 are mounted on counter sunk shoulder screws 176 that fasten the lock plate 130 and the alignment plate 110 together. When the test head 1300 is not in use, springs 120 keep the top surface 110B of the alignment plate 110 and the bottom surface 130A of the lock plate 130 spaced apart, and springs 220 keep the bottom surface 110A of the alignment plate 110 and the top surface 95B of the manifold 90 spaced apart (see FIG. 7).

Test head 1300 also includes a pair of support members 250 that connect the alignment mechanism 150 to the contact assembly 20. As best seen in FIG. 7, at a top end the support members 250 are attached to the alignment plate 110. And, and at a bottom end the support members 250 are attached to a substrate-contact member 224 of contact assembly 20. FIG. 12 is an exploded view of the contact assembly 20 of test head 1300. In addition to the die-contact member 24 with a pedestal 26 that contacts and applies a compressive force on the die 12 (of DUT 10) during a test, contact assembly 20 of test head 1300 includes a substrate-contact member 224 that contacts and applies a force on the substrate 14 (of DUT 10) during the test. With reference to FIGS. 7 and 12, in contact assembly 20, the substrate-contact member 224 is positioned below the die-contact member 24. A guide pin 260 located on the bottom surface of the die-contact member 24 fits into a corresponding recess formed on the substrate-contact member 224 to correctly align the two contact members. When correctly aligned, pedestal 26 of the die-contact member 24 that contacts the die 12 protrudes downwards from the bottom surface of the die-contact member 24 through a cavity 228 formed on the substrate-contact member 224. A bracket 226, extending around the cavity 228, projects downwards from the bottom surface of the substrate-contact member 224 to contact the substrate 14 (of DUT 10) during a test. Locating pins 160 on the substrate-contact member 224 engage with a corresponding feature on the DUT 10 (e.g., a socket that the DUT 10 is mounted on) to align the pedestal 26 and the bracket 226 with the DUT 10. In the embodiment of test head 1300 illustrated in FIG. 7, the bracket 226 contacts the substrate 14 in an area shaped like a square (or rectangular) annulus around the die 12. However, this is only exemplary. In general, the bracket 226 may be configured to contact and apply a compressive force on any area of the substrate 14.

FIGS. 13A-13C are schematic illustrations of testing a DUT 10 using the test head 1300. With reference to FIGS. 13A and 13B, to test a DUT 10 using the test head 1300, the cylinder head 200 (see FIG. 7) lowers the test head 1300 on the DUT 10 such that the bottom surface 25A of the pedestal 26 contacts and applies a compressive force on the surface of the die 12. When the cylinder head 200 pushes the test head 1300 against the surface of the die 12, the springs 120 and 220 of the alignment mechanism 150 compress until the bottom surface 130A of the lock plate 130 contacts the convex-shaped projection 112 on the top surface 110B of the alignment plate 110. If the surface of the die 12 is not parallel to the bottom surface 25A when they engage, the springs 120 compress by different amounts to rotate the test head 1300 such that the bottom surface 25A becomes parallel to the die surface. Thus, as in test head 300, the alignment mechanism 150 ensures that mating surfaces of the test head 1300 and the DUT 10 engage in a parallel manner. Upon further application of compressive force by the cylinder head 200 on the test head 1300, springs 220 of the alignment mechanism 150 compress to move the substrate-support member 250 towards the DUT 10 such that the bracket 226 contacts and applies compressive force on the substrate 14. In some embodiments, the total stiffness (i.e., effective stiffness) of springs 220 may be greater than the total stiffness of springs 120 such that when a compressive force is initially applied on the DUT 10 using the test head 1300, springs 120 compress more than springs 220. That is, when the number of springs 220 and 120 are $n_{220}$ and $n_{120}$ respectively, and the stiffness of each spring 220 and 120 is $k_{220}$ and $k_{120}$, respectively, the effective stiffness of springs 220 (i.e., $n_{220}*k_{220}$) may be greater than the effective stiffness of springs 120 (i.e., $n_{120}*k_{120}$). It is also contemplated that, in some embodiments, the effective stiffness of springs 220 may be substantially equal to the effective stiffness of springs 120, and in some embodiments, the effective stiffness of springs 120 may be greater that the effective stiffness of springs 220. In general, the stiffness of the springs 120 and 220 may be such that the test head 1300 applies a desired force on the die 12. The maximum compressive on the substrate 14 may be controlled by a pressure regulator of the cylinder head 200.

As explained previously, the description of test head 300 provided with reference to FIGS. 1-6 is applicable to test head 1300 of FIG. 7, and the description of test head 1300 provided with reference to FIGS. 7-13C is applicable to test head 300 of FIG. 1. It will be apparent to those skilled in the art that various modifications and variations can be made to the test head of the present disclosure. Other embodiments of the test head will be apparent to those skilled in the art from consideration of the specification and practice of the test head disclosed herein. It is intended that the specification and examples be considered as exemplary only.

What is claimed is:

1. A thermal test head for an integrated circuit device including a die mounted on a substrate, the thermal test head comprising:
   a heat exchanger assembly configured to circulate a fluid therethrough, the heat exchanger assembly including
     a manifold defining a cavity,
     a cold plate including micro-fins on a first surface of the cold plate, and
     a channel body defining fluid-flow channels, wherein the micro-fins and the channel body are disposed in the cavity of the manifold;
   a die-contact member configured to contact the die; and
   a thermal control assembly disposed between the heat exchanger assembly and the die-contact member, the thermal control assembly including
   a Peltier device in thermal contact with opposing surfaces of the heat exchanger assembly and the die-contact member, and
   a spacer in physical contact with the opposing surfaces of the heat exchanger assembly and the die-contact member.

2. The thermal test head of claim 1, wherein the spacer is disposed at least partially around the Peltier device.

3. The thermal test head of claim 1, wherein the cold plate includes thermally conductive metal, the manifold includes plastic material, and the channel body includes one of metal or plastic material.

4. The thermal test head of claim 1, wherein the spacer has an annular shape defining a central opening, and wherein the Peltier device is disposed in the central opening of the spacer.

5. The thermal test head of claim 1, further including
   a first layer of thermal interface material disposed between the Peltier device and the die-contact member, and
   a second layer of thermal interface material disposed between the Peltier device and the heat exchanger assembly,
   wherein a height of the spacer is substantially equal to a sum of a height of the Peltier device, a height of the first layer of thermal interface material, and a height of the second layer of thermal interface material.

6. The thermal test head of claim 1, further including an inclination-adjustment device coupled to a first surface of the heat exchanger assembly and disposed opposite the thermal control assembly, wherein the inclination-adjustment device includes
   an alignment plate coupled to the first surface of the heat exchanger assembly,
   a lock plate disposed above the alignment plate and configured to move towards and away from the alignment plate, and
   multiple springs disposed between the lock plate and the alignment plate,
   wherein the multiple springs bias the lock plate away from the alignment plate.

7. The thermal test head of claim 6, wherein the alignment plate includes a substantially convex shaped projection extending towards the lock plate, and wherein the multiple springs of the inclination-adjustment device are disposed around the projection.

8. The thermal test head of claim 6, wherein the inclination-adjustment device is configured to vary an angular alignment of a contact surface of the die-contact member, wherein the contact surface is configured to contact the die.

9. A thermal test head for an integrated circuit device including a die mounted on a substrate, the thermal test head comprising:
   a heat exchanger assembly configured to circulate a fluid therethrough;
   a die-contact member including a contact surface, the contact surface being configured to contact the die; and
   a thermal control assembly disposed between the heat exchanger assembly and the die-contact member, the thermal control assembly including
   a Peltier device in thermal contact with opposing surfaces of the heat exchanger assembly and the die-contact member, and
   one or more spacers disposed at least partially around the Peltier device, the one or more spacers being in physical contact with the opposing surfaces of the heat exchanger assembly and the die-contact member; and
   an inclination-adjustment device coupled to the heat exchanger assembly opposite the thermal control assembly, wherein the inclination-adjustment device is configured to change an angular alignment of the contact surface of the die-contact member when the contact surface contacts the die.

10. The thermal test head of claim 9, further including
    a first layer of thermal interface material disposed between the Peltier device and the die-contact member, and
    a second layer of thermal interface material disposed between the Peltier device and the heat exchanger assembly,
    wherein a height of the one or more spacers is substantially equal to a sum of a height of the Peltier device, a height of the first layer of thermal interface material, and a height of the second layer of thermal interface material.

11. The thermal test head of claim 9, wherein the one or more spacers include plastic or ceramic material.

12. The thermal test head of claim 9, wherein the inclination-adjustment device includes
an alignment plate coupled to a surface of the heat exchanger assembly,
a lock plate positioned above the alignment plate and configured to move towards and away from the alignment plate, and
multiple springs disposed between the lock plate and the alignment plate, wherein the multiple springs bias the lock plate away from the alignment plate.

13. The thermal test head of claim 12, wherein
a first surface of the alignment plate that faces the lock plate includes a substantially convex shaped projection extending towards the lock plate, and
a second surface of the alignment plate opposite the first surface is directly attached to the surface of the heat exchanger assembly.

14. The thermal test head of claim 9, wherein the heat exchanger assembly includes
a manifold defining a cavity,
a cold plate including micro-fins, and
a channel body defining fluid-flow channels,
the micro-fins and the channel body being disposed in the cavity of the manifold.

15. A thermal test head for an integrated circuit device including a die mounted on a substrate, the thermal test head comprising:
a heat exchanger assembly configured to circulate a fluid therethrough;
a thermally conductive die-contact member including a contact surface, the contact surface being configured to contact the die; and
a thermal control assembly disposed between a first surface of the die-contact member and a second surface of the heat exchanger assembly, wherein the thermal control assembly includes:
a Peltier device,
a first layer of thermal interface material disposed between, and in physical contact with, the Peltier device and the first surface of the die-contact member,
a second layer of thermal interface material disposed between, and in physical contact with, the Peltier device and the second surface of the heat exchanger assembly, and
one or more spacers disposed at least partially around the Peltier device and in physical contact with the first surface of the die-contact member and the second surface of the heat exchanger assembly, wherein a height of the one or more spacers is substantially equal to a sum of a height of the Peltier device, a height of the first layer of thermal interface material, and a height of the second layer of thermal interface material.

16. The thermal test head of claim 15, further including an inclination-adjustment device coupled to a third surface of the heat exchanger assembly opposite the second surface, wherein the inclination-adjustment device is configured to change an angular alignment of the contact surface of the die-contact member when the contact surface contacts the die.

17. The thermal test head of claim 16, wherein the inclination-adjustment device includes
an alignment plate coupled to the third surface of the heat exchanger assembly,
a lock plate disposed above the alignment plate and configured to move towards and away from the alignment plate, and
multiple springs disposed between the lock plate and the alignment plate, wherein the multiple springs bias the lock plate away from the alignment plate.

18. The thermal test head of claim 16, wherein
a surface of the alignment plate that faces the lock plate includes a substantially convex shaped projection extending towards the lock plate, and
the multiple springs are disposed around the projection.

* * * * *